United States Patent
Secareanu et al.

(10) Patent No.: US 7,608,913 B2
(45) Date of Patent: Oct. 27, 2009

(54) NOISE ISOLATION BETWEEN CIRCUIT BLOCKS IN AN INTEGRATED CIRCUIT CHIP

(75) Inventors: Radu M. Secareanu, Phoenix, AZ (US); Suman K. Banerjee, Chandler, AZ (US); Olin L. Hartin, Phoenix, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 329 days.

(21) Appl. No.: 11/360,285

(22) Filed: Feb. 23, 2006

(65) Prior Publication Data

US 2007/0194394 A1    Aug. 23, 2007

(51) Int. Cl.
*H01L 23/58* (2006.01)
*H01L 23/62* (2006.01)
*H01L 29/00* (2006.01)

(52) U.S. Cl. .................. 257/665; 257/547; 257/499; 257/659; 257/E21.544

(58) Field of Classification Search .............. 257/509, 257/504, 544, 507, 547, 665, 499, 500, 659, 257/E21.544
See application file for complete search history.

(56) References Cited

U.S. PATENT DOCUMENTS

| | | | |
|---|---|---|---|
| 5,196,920 A | 3/1993 | Kumamoto et al. | |
| 5,475,255 A * | 12/1995 | Joardar et al. | 257/547 |
| 6,057,588 A * | 5/2000 | Yamazaki | 257/506 |
| 6,424,022 B1 * | 7/2002 | Wu et al. | 257/665 |
| 6,563,181 B1 | 5/2003 | Du et al. | |
| 6,737,713 B2 | 5/2004 | Goergescu et al. | |
| 7,071,530 B1 * | 7/2006 | Ding et al. | 257/508 |
| 2004/0061183 A1 | 4/2004 | Johnson et al. | |
| 2004/0099878 A1 | 5/2004 | Huang et al. | |
| 2004/0099906 A1 | 5/2004 | Ji et al. | |
| 2004/0142528 A1 | 7/2004 | Bhattacharyya | |
| 2006/0060934 A1 * | 3/2006 | Lien et al. | 257/499 |

OTHER PUBLICATIONS

International Search report for corresponding PCT Application No. PCT/US07/60655 mailed Nov. 21, 2008.

* cited by examiner

*Primary Examiner*—Shouxiang Hu
(74) *Attorney, Agent, or Firm*—Ingrassia, Fisher & Lorenz, P.C.

(57) ABSTRACT

An integrated circuit includes a p-well block region having a high resistivity due to low doping concentration formed in a region of a substrate for providing noise isolation between a first circuit block and a second circuit block. The integrated circuit further includes a guard region formed surrounding the p-well block region for providing noise isolation between the first circuit block and the second circuit block.

3 Claims, 5 Drawing Sheets

NOISE ISOLATION BETWEEN CIRCUIT BLOCKS IN AN INTEGRATED CIRCUIT CHIP

BACKGROUND OF THE INVENTION

1. Field of the Invention

This invention relates in general to integrated circuits and more specifically to noise isolation between circuit blocks in an integrated circuit chip.

2. Description of the Related Art

Increasingly, integrated circuit chips have different types of circuit blocks, such as analog and digital circuit blocks. Without proper noise isolation, noise generated by digital circuit blocks can interfere with more sensitive circuit blocks, such as phase locked loops and low noise amplifier circuits. Conventional noise isolation between different types of circuit blocks requires bias. Bias, however, is prone to contamination and thus compromises noise isolation efficiency.

Thus, there is a need for improved noise isolation between circuit blocks in an integrated circuit chip.

BRIEF DESCRIPTION OF THE DRAWINGS

The present invention may be better understood, and its numerous objects, features, and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, an integrated circuit, including a p-well block region having a high resistivity due to low doping concentration formed in a region of a substrate for providing noise isolation between a first circuit block and a second circuit block, is provided. The integrated circuit further includes a guard region formed surrounding the p-well block region for providing noise isolation between the first circuit block and the second circuit block.

In another aspect, an integrated circuit, including a p-well block region formed in a substrate by blocking insertion of any dopants in a region of the substrate for providing noise isolation between a first circuit block and a second circuit block, is provided. The integrated circuit further includes a guard region formed surrounding the p-well block region for providing noise isolation between the first circuit block and the second circuit block. The integrated circuit further includes a first grounded highly doped region formed between the guard region and the first circuit block and a second grounded highly doped region formed between the guard region and the second circuit block. The integrated circuit further includes a grounded conductive shield formed over a dielectric layer formed at least over the p-well block region and the guard region.

In yet another aspect, an integrated circuit including a p-well block region formed in a substrate by blocking insertion of any dopants in a region of the substrate for providing noise isolation between a first circuit block and a second circuit block, is provided. The integrated circuit further includes a guard region formed surrounding the p-well block region for providing noise isolation between the first circuit block and the second circuit block. The integrated circuit further includes a first grounded highly doped region formed between the guard region and the first circuit block and a second grounded highly doped region formed between the guard region and the second circuit block. The integrated circuit further includes a grounded conductive shield formed over a dielectric layer formed at least over the p-well block region and the guard region. The integrated circuit further includes a trench formed surrounding the guard region.

Figure 1:
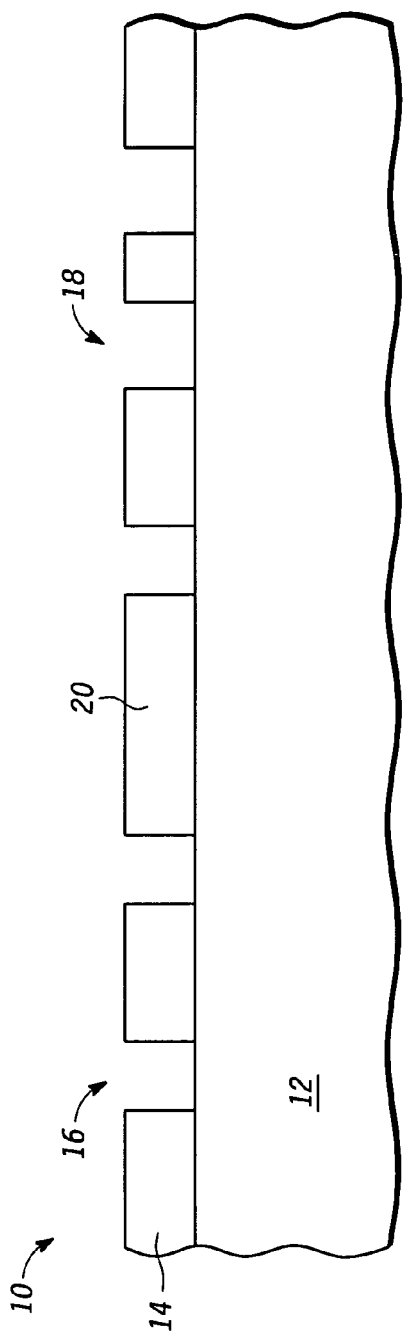
FIG. 1 is a partial side view of one embodiment of an integrated circuit during a processing stage, consistent with one embodiment of the invention.

FIG. 1 is a partial side view of one embodiment of an integrated circuit during a processing stage, consistent with one embodiment of the invention. Integrated circuit 10 may include a substrate 12. Using a mask 14 various circuit blocks may be formed in substrate 12. Circuit blocks may be formed in different regions, such as 16, and 18. Although FIG. 1 shows only one mask layer, additional mask layers may be used as part of the formation of various circuit blocks in substrate 12. Using a part 20 of mask 14 a region of substrate 12 may be processed such that it does not receive any dopants.

Figure 2:
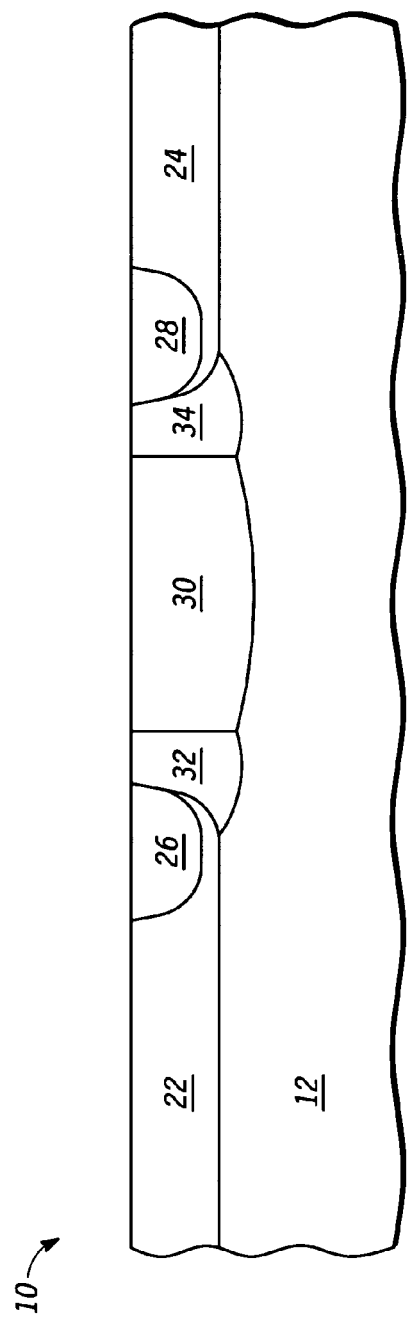
FIG. 2 is a partial side view of one embodiment of an integrated circuit during a processing stage, consistent with one embodiment of the invention.

Referring now to FIG. 2, a first circuit block 22 and a second circuit block 24 may be formed in substrate 12 using various patterning and implanting steps (not shown). A p-well block region 30 may be formed under part 20 of mask 14, for example. P-well block region 30 may provide noise isolation between first circuit block 22 and second circuit block 24. P-well block region 30 may have a high resistivity due to a low doping concentration. By way of example, p-well block region 30 may have a low doping concentration because insertion of any dopants may be blocked into this region. Alternatively, the doping concentration of p-well block region 30 may be lowered by counter-doping, for example. Guard regions 32 and 34 may be formed surrounding p-well block region 30 for providing additional noise isolation between first circuit block 22 and second circuit block 24. By way of example, guard regions 32 and 34 may represent areas surrounding p-well block region 30 with an intermediate amount of doping compared to the low-doped p-well block region 30. Guard regions 32 and 34, however, may not be as highly doped as the p+ doped regions 26, 28, for example. By way of example, guard regions 32 and 34 may have the same depth as the depth of the p-well block region 30. To provide additional noise isolation a first highly doped region 26 may be formed between guard region 32 and first circuit block 22. A second highly doped region 28 may be formed between guard region 34 and second circuit block 24. First highly doped region 26 and second highly doped region 28 may be grounded. By way of example, first highly doped region 26 and second highly doped region 28 may be doped using a p-type dopant, such as boron or indium, to achieve a p+ type of doping.

Figure 3:
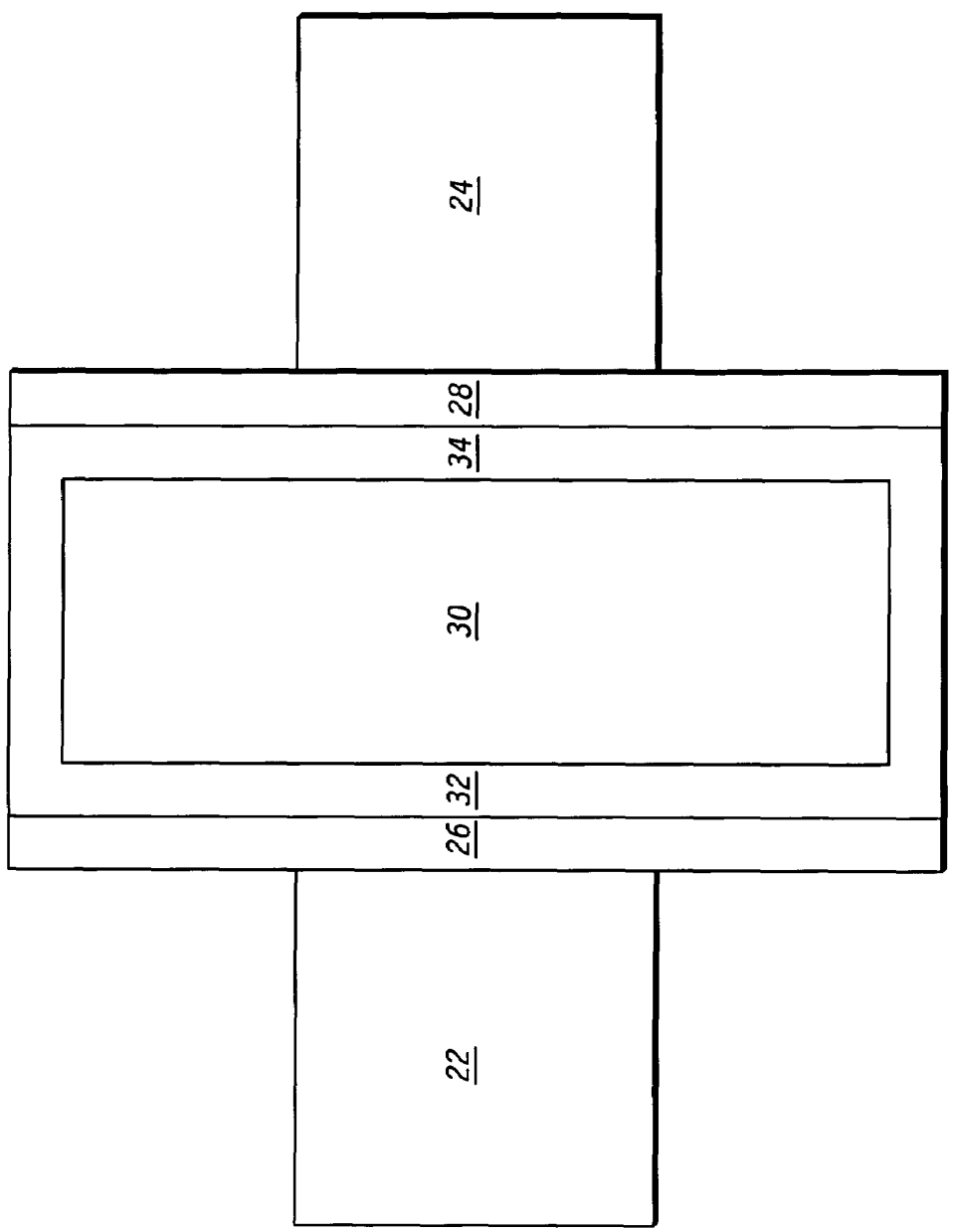
FIG. 3 is a partial side view of one embodiment of an integrated circuit during a processing stage, consistent with one embodiment of the invention.

FIG. 3, consistent with one embodiment of the invention, shows a top view of a p-well block region 30 formed as a wall between first circuit block 22 and second circuit block 24. Guard regions 32 and 34 may be formed as a ring surrounding the wall shaped p-well block region. First highly doped region 26 may be formed between guard region 32 and first circuit block 22. Second highly doped region 28 may be formed between guard region 34 and second circuit block 24.

Figure 4:
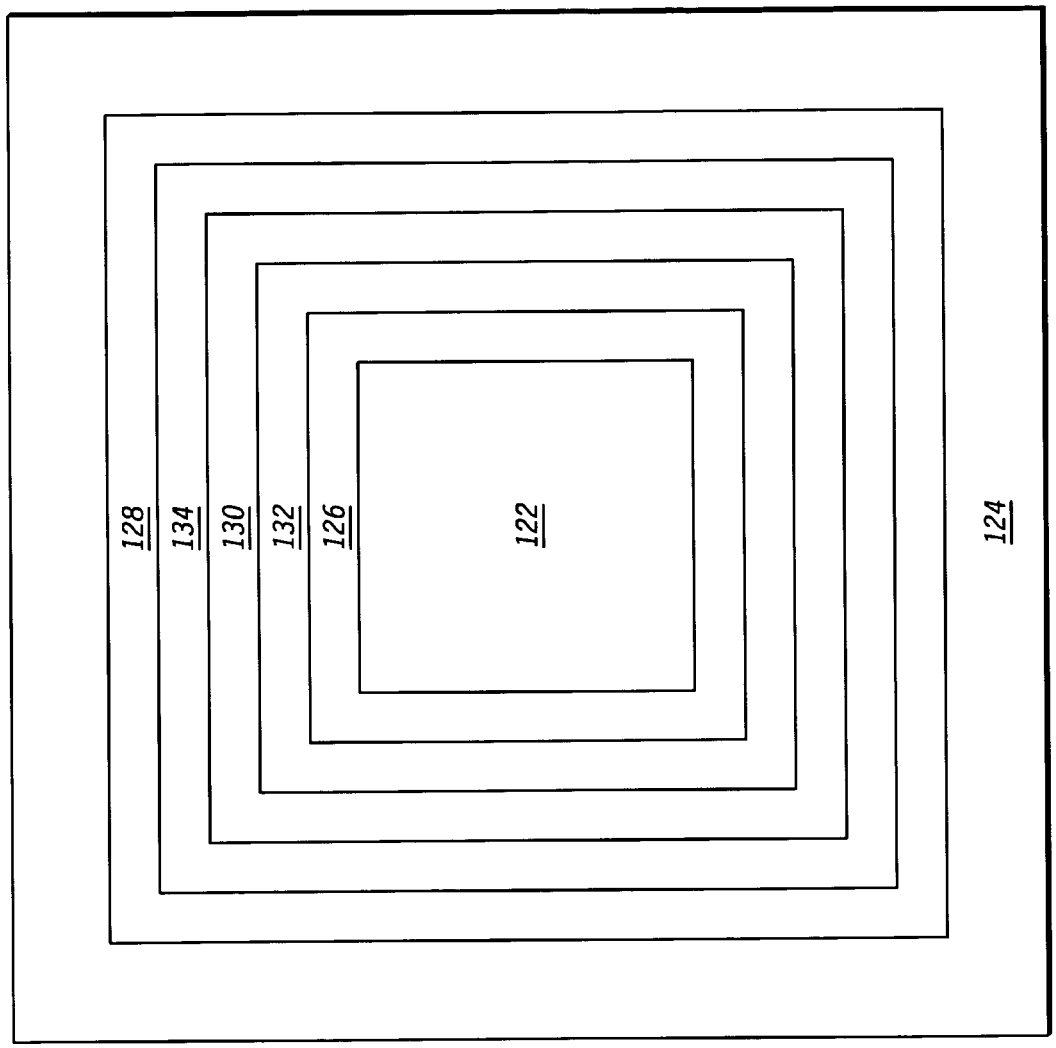
FIG. 4 is a partial side view of one embodiment of an integrated circuit during a processing stage, consistent with one embodiment of the invention.

FIG. 4, consistent with another embodiment of the invention, shows a top view of a p-well region formed 130 as ring formed between first circuit block 122 and second circuit block 124. Guard regions 132 and 134 may be formed as rings surrounding the ring shaped p-well block region 130. First highly doped region 126 may be formed between guard region 132 and first circuit block 122. Second highly doped region 128 may be formed between guard region 134 and second circuit block 124. Although FIGS. 3 and 4 show only two exemplary circuit blocks, integrated circuit 10 may include additional circuit blocks with additional noise isolation structures.

Figure 5:
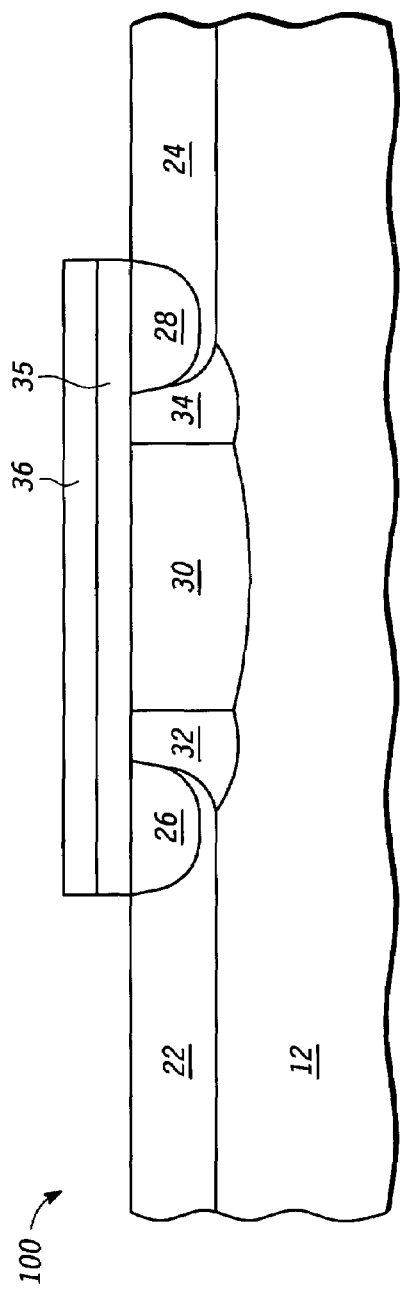
FIG. 5 is a partial side view of one embodiment of an integrated circuit during a processing stage, consistent with one embodiment of the invention.

Referring now to FIG. 5, FIG. 5 shows an integrated circuit 100 comprising the same elements as of FIG. 2, and further including a dielectric layer 35 formed over at least p-well block region 30 and guard regions 32 and 34. In addition, by way of example, a conductive shield 36 may be formed over dielectric layer 35. Conductive shield 36 may be grounded to provide additional noise isolation between first circuit block 22 and second circuit block 24. Although FIG. 5 shows only one dielectric layer between conductive shield 36 and p-well block region 30, additional layers may be formed between conductive shield 36 and p-well block region 30. Further, an interconnect (not shown) connecting first circuit block 22 to second circuit block 24 may be formed at a greater distance from a top surface of substrate 12 in a region directly above p-well block region 30 than other regions above substrate 12. Additionally, conductive shield 36 may be positioned such that an area occupied by conductive shield 36 over first circuit block 22 is different from an area occupied by the conductive shield 36 over second circuit block 24. This may be achieved for example, by altering one or both of the length and width of conductive shield 36. Additionally and/or alternatively, at least one interconnect may be positioned such that an area occupied by the at least one interconnect over first circuit block 22 is different from an area occupied by the at least one interconnect over second circuit block 24. This may be achieved for example, by altering one or both of the length and the width of the at least one interconnect.

Figure 6:
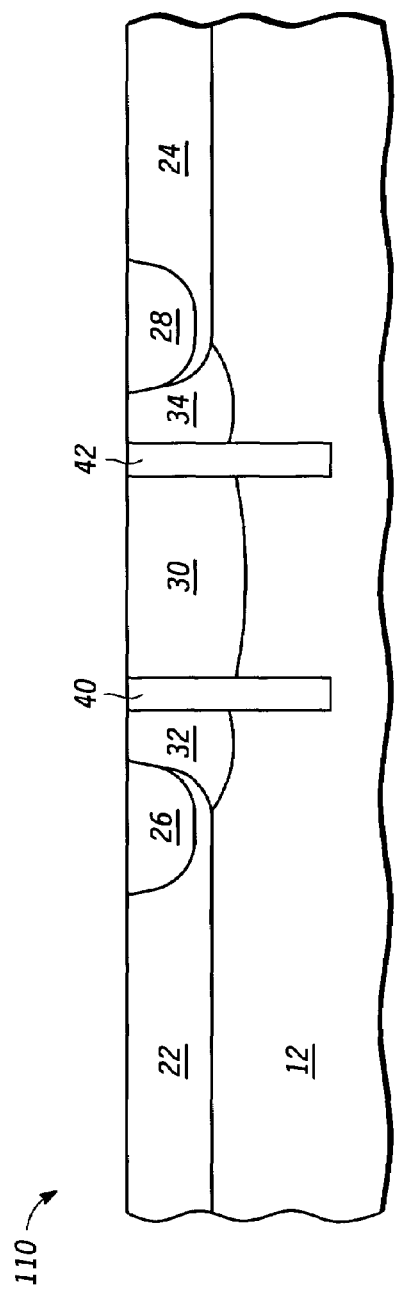
FIG. 6 is a partial side view of one embodiment of an integrated circuit during a processing stage, consistent with one embodiment of the invention.

Referring now to FIG. 6, FIG. 6 shows an integrated device 110 having trenches 40 and 42, in addition to the elements of integrated circuit 10 of FIG. 2. Trenches 40 and 42 may provide additional noise isolation between first circuit block 22 and second circuit block 24. Although FIG. 6 shows trenches 40 and 42 extending beyond guard regions 32 and 34, trenches 40 and 42 may be only as deep as guard regions 32 and 34, respectively.

Figure 7:
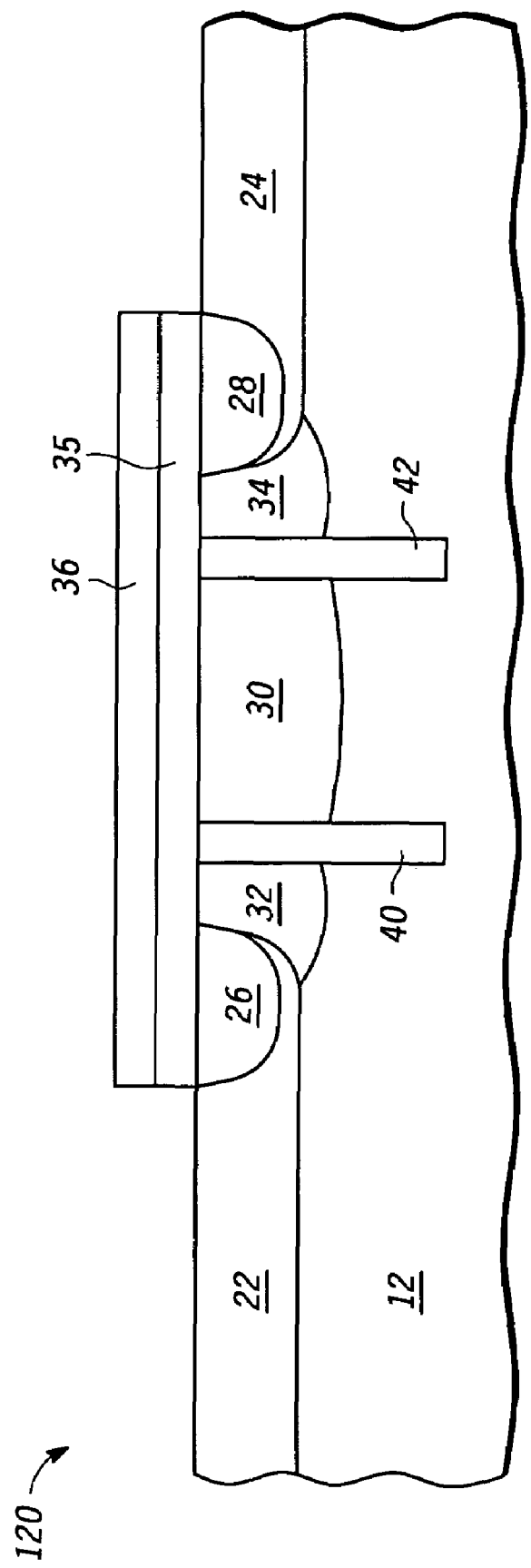
FIG. 7 is a partial side view of one embodiment of an integrated circuit during a processing stage, consistent with one embodiment of the invention.

FIG. 7 shows an integrated device 120 having a dielectric layer 35 and a conductive shield 36, in addition to elements of integrated circuit 110 of FIG. 6. Conductive shield 36 may be grounded to provide additional noise isolation between first circuit block 22 and second circuit block 24. Although FIG. 5 shows only one dielectric layer between conductive shield 36 and p-well block region 30, additional layers may be formed between conductive shield 36 and p-well block region 30. Further, an interconnect (not shown) connecting first circuit block 22 to second circuit block 24 may be formed at a greater distance from a top surface of substrate 12 in a region directly above p-well block region 30 than other regions above substrate 12. Additionally, conductive shield 36 may be positioned such that an area occupied by conductive shield 36 over first circuit block 22 is different from an area occupied by the conductive shield 36 over second circuit block 24. This may be achieved for example, by altering one or both of length and width of conductive shield 36. Additionally and/or alternatively, at least one interconnect may be positioned such that an area occupied by the at least one interconnect over first circuit block 22 is different from an area occupied by the at least one interconnect over second circuit block 24. This may be achieved for example, by altering one or both of the length and the width of the at least one interconnect.

In the foregoing specification, the invention has been described with reference to specific embodiments. However, one of ordinary skill in the art appreciates that various modifications and changes can be made without departing from the scope of the present invention as set forth in the claims below. For example, although the p-well block region has been described as placed between two circuit blocks to provide noise isolation between the two circuit blocks, p-well block region may also be placed between ESD pads or digital pads. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
    a first circuit block formed in a substrate;
    a second circuit block formed in the substrate; and
    a plurality of regions formed between the first circuit block and the second circuit block, wherein the plurality of regions are configured to provide noise isolation between the first circuit block and the second circuit block, and the plurality of regions includes:
    a p-well block region formed in the substrate, which has a first doping concentration of a p-type dopant,
    a first portion of a guard region formed in the substrate between the p-well block region and the first circuit block, wherein the first portion of the guard region has a second doping concentration of a p-type dopant,
    a second portion of the guard region formed in the substrate between the p-well block region and the second circuit block, wherein the second portion of the guard region has the second doping concentration,
    a first grounded highly doped region formed in the substrate between the first portion of the guard region and the first circuit block, wherein the first grounded highly doped region has a third doping concentration of a p-type dopant, and a second grounded highly doped region formed in the substrate between the second portion of the guard region and the second circuit block, wherein the second grounded highly doped region has the third doping concentration, and wherein the second doping concentration is higher than the first doping concentration;

wherein the guard region has an intermediate amount of doping between the first doping concentration of the p-well block region and the third doping concentration of the first grounded highly doped region;

wherein the p-well block region does not include any active region therein; and wherein the guard region surrounds the p-well block region and has a depth substantially deeper than that of the first and second grounded highly doped regions.

2. The integrated circuit of claim 1, wherein the p-well block region is a wall formed between the first circuit block and the second circuit block.

3. The integrated circuit of claim 1, wherein the guard region contacts the p-well block region, and the first and second grounded highly doped regions contact the guard region.

* * * * *

UNITED STATES PATENT AND TRADEMARK OFFICE
CERTIFICATE OF CORRECTION

PATENT NO. : 7,608,913 B2 Page 1 of 1
APPLICATION NO. : 11/360285
DATED : October 27, 2009
INVENTOR(S) : Secareanu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 405 days.

Signed and Sealed this

Twelfth Day of October, 2010

David J. Kappos
*Director of the United States Patent and Trademark Office*